United States Patent
Douskey et al.

(10) Patent No.: US 10,379,159 B1
(45) Date of Patent: Aug. 13, 2019

(54) MINIMIZATION OF OVER-MASKING IN AN ON PRODUCT MULTIPLE INPUT SIGNATURE REGISTER (OPMISR)

(71) Applicant: International Business Machines Corporation, Armonk, NY (US)

(72) Inventors: Steven M. Douskey, Rochester, MN (US); Michael J. Hamilton, Rochester, MN (US); Amanda R. Kaufer, Rochester, MN (US); Matthew B. Schallhorn, Greensboro, NC (US); Mary P. Kusko, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/050,680

(22) Filed: Jul. 31, 2018

(51) Int. Cl.
*G01R 31/317* (2006.01)
*G01R 31/3177* (2006.01)
*G01R 31/3185* (2006.01)

(52) U.S. Cl.
CPC ..... *G01R 31/3177* (2013.01); *G01R 31/3172* (2013.01); *G01R 31/318541* (2013.01); *G01R 31/318544* (2013.01)

(58) Field of Classification Search
CPC ........ G01R 31/3177; G01R 31/318544; G01R 31/3172; G01R 31/318541; G01R 31/318552; G01R 31/31704; G06F 17/505
See application file for complete search history.

(56) References Cited

U.S. PATENT DOCUMENTS

| 6,715,105 B1 * | 3/2004 | Rearick .......... G01R 31/318547 714/30 |
| 6,807,645 B2 * | 10/2004 | Angelotti ......... G01R 31/31813 714/729 |
| 7,032,148 B2 | 4/2006 | Wang et al. |
| 7,461,309 B2 * | 12/2008 | Kiryu ............. G01R 31/318544 714/724 |

(Continued)

FOREIGN PATENT DOCUMENTS

| WO | WO2008069113 A1 | 12/2008 |
| WO | WO2011144331 A1 | 11/2011 |

OTHER PUBLICATIONS

C. Barnhart, V. Brunkhorst, F. Distler, O. Farnsworth, B. Keller and B. Koenemann, "OPMISR: the foundation for compressed ATPG vectors," Proceedings International Test Conference 2001 (Cat. No. 01CH37260), Baltimore, MD, USA, 2001, pp. 748-757.*

(Continued)

*Primary Examiner* — Cynthia Britt
(74) *Attorney, Agent, or Firm* — Joan Pennington

(57) ABSTRACT

A method and circuit are provided for implementing enhanced scan data testing with minimization of over masking in an on product multiple input signature register (OPMISR) test due to Channel Mask Enable (CME) sharing, and a design structure on which the subject circuit resides. A common Channel Mask Scan Registers (CMSR) logic is used with a multiple input signature register (MISR). Individual local addressing is used for implementing enhanced scan data testing. An architecture and algorithm efficiently expand and target the use of the CME pins to minimize over-masking, to increase test pattern effectiveness with the use of individual local addressing.

20 Claims, 11 Drawing Sheets

(56) References Cited

U.S. PATENT DOCUMENTS

| | | | |
|---|---|---|---|
| 7,500,163 B2* | 3/2009 | Rajski | G01R 31/318547 714/729 |
| 7,509,551 B2* | 3/2009 | Koenemann | G01R 31/31703 714/732 |
| 7,523,370 B1 | 4/2009 | Keller | |
| 7,823,034 B2* | 10/2010 | Wohl | G01R 31/318547 714/726 |
| 8,006,150 B2* | 8/2011 | Sinanoglu | G01R 31/318547 714/726 |
| 8,086,923 B2* | 12/2011 | Cheng | G01R 31/31813 714/726 |
| 8,103,926 B2* | 1/2012 | Gizdarski | G01R 31/318547 714/25 |
| 8,438,437 B2* | 5/2013 | Jain | G01R 31/318547 714/726 |
| 8,756,468 B2 | 7/2014 | Sinanoglu | |
| 9,355,203 B2* | 5/2016 | Douskey | G06F 17/5072 |
| 9,448,282 B1 | 9/2016 | Meehl | |
| 9,702,934 B1 | 7/2017 | Meehl et al. | |
| 2009/0300446 A1* | 12/2009 | Rajski | G01R 31/318547 714/726 |
| 2012/0278672 A1* | 11/2012 | Sinanoglu | G01R 31/318547 714/726 |
| 2016/0341795 A1* | 11/2016 | Chandra | G01R 31/318536 |

OTHER PUBLICATIONS

B. Keller, "Encounter test OPMISR/sup +/ on-chip compression," IEEE International Conference on Test, 2005., Austin, TX, 2005, pp. 2 pp. 1287.*

O. Sinanoglu, "Toggle-Based Masking Scheme for Clustered Unknown Response Bits," 2011 Sixteenth IEEE European Test Symposium, Trondheim, 2011, pp. 105-110.*

S. Kim, J. Chung and J. Yang, "Mitigating Observability Loss of Toggle-BasedX-Masking via Scan Chain Partitioning," in IEEE Transactions on Computers, vol. 67, No. 8, pp. 1184-1192, Aug. 1, 2018.*

J. Kang, N. A. Touba and J. Yang, "Reducing control bit overhead for X-masking/X-canceling hybrid architecture via pattern partitioning," 2016 53nd ACM/EDAC/IEEE Design Automation Conference (DAC), Austin, TX, 2016, pp. 1-6.*

S. Ohtake and D. Shimazu, "An approach to LFSR-based X-masking for built-in self-test," 2017 18th IEEE Latin American Test Symposium (LATS), Bogota, 2017, pp. 1-4.*

Chapter 06 Compression (see p. 68) Broadcast-scan-based schemes Single step—SPMISR+, Cadence—VirtualScan and UltraScan, SynTest—DFT MAX, Synopsys http://booksite.elsevier.com/9780123705976/errata/11~Chapter%2006%20Compression.pdf.

Appendix P List of Patents and Patent Applications Treated as Related Feb. 6, 2019.

* cited by examiner

230

| B0 | B1 | FUNCTION |
|----|----|----|
| 0 | 0 | NO MASKING (MISR ENABLED) |
| 0 | 1 | MASK USING REGISTER0 (MISR ENABLED) |
| 1 | 0 | MASK USING REGISTER1 (MISR ENABLED) |
| 1 | 1 | GLOBAL MISR MASK ALL CHANNELS |

| SCAN CYCLE | 502 CMEAs | 404 | 406 | 408 | 410 | 412 | 414 | 416 |
|---|---|---|---|---|---|---|---|---|
| 8 | 4,6,12 | 0 | 0 | 0 | D1 | E2 | F1 | G2 |
| 8 | 4,6,12,14 | 0 | 0 | 0 | D1 | E2 | F1 | G2 |
| 7 | 4,6,14 | 0 | 0 | 0 | D1 | 0 | F1 | G2 |
| 8 | 4,6,12 | 0 | 0 | 0 | D1 | E2 | F1 | G2 |

FIG. 5

MINIMIZATION OF OVER-MASKING IN AN ON PRODUCT MULTIPLE INPUT SIGNATURE REGISTER (OPMISR)

FIELD OF THE INVENTION

The present invention relates generally to the data processing field, and more particularly, relates to a method and circuit for implementing enhanced scan data testing with minimization of over masking in an on product multiple input signature register (OPMISR) test due to Channel Mask Enable (CME) sharing, and a design structure on which the subject circuit resides.

BACKGROUND

Circuits typically are prone to defects introduced during a manufacturing process. To test for defects, a scan input may be applied to scan channels, clocks triggered and the result of the scan outputs from the scan channels may be analyzed. The test may include large numbers and variations of scan inputs being applied to scan channels of the circuit. Typically the tests take a great amount of time, produce large amounts of data for analysis, and require large amounts of resources for that analysis.

As Application Specific Integrated Circuit (ASIC) and Processor chips continue to get larger, test data volume and test time naturally increase as well. It continually becomes even more important to increase test efficiency. One method to increase efficiency is to deliver scan data in parallel to many parts of the chip at once, usually through a fan-out network feeding to many channels, which in turn feed a section of logic on the chip, and have that accompanied with a Multiple Input Signature Register (MISR) for on-chip data compression. This technique is called On Product Multiple Input Signature Register (OPMISR). This also includes a method for masking specific data in the channels, which can be used to prevent possible corruption of the MISR. This method for masking specific data in the channels method including an OPMISR+ and OPMISR++ test versions were developed and are supported by Cadence Corporation.

Typically, OPMISR masking has two mask latches per MISR bit that are referred to as Channel Mask Scan Bits in Channel Mask Scan Registers (CMSRs) and two Channel Mask Enable (CME) signals. The CME signals decode to four states of: no masking, use mask bit 1, use mask bit 2, or mask all channels. The masking is applied as the data is unloaded from the channel into the MISR. When a bit position in a channel is going to shift into the MISR, the global CME signal is set to the desired mask state. For example, if channel 3 needs scan position 28 to be ignored, when bit 28 of the channel is about to be shifted into the MISR during the unload, the CME signals could be set to use mask register 1. The channel 3 mask scan bit in mask register 1 would have previously been set to mask. Other mask bits for other channels may or may not have been set to mask based on needs for the rest of the scan unload.

In large complex processors there can be more than one MISR. As used in the following description and claims, an OPMISR+ satellite includes one MISR and the channels above the MISR. With common Channel Mask Scan Registers (CMSRs) scanned into multiple OPMISR+ satellites and a global pair of Channel Mask Enable (CME) signals, typically there is over masking in OPMISR+ test patterns, which reduces the effectiveness of the patterns. It can be more practical to have several of these OPMISR+ satellites spread throughout the chip. For most efficient scanning and less scan data, the Channel Mask Scan Bits for register 0 and register 1 are scan initialized in parallel and shared across satellites. However, this means all satellites have the same mask bits. Additionally, typically all satellites get the same CME information during unload. For example, assume the first satellite needed bit 4 of the channel mask scan register set and used at the scan position 28 but the second satellite did not. With both satellites receiving the same data for the channel mask scan register the bit in the second satellite would unnecessarily be masked at the same time as the bit in the first mask register.

Thus, while it is efficient to share channel mask enable pins, one is left with the problem of over masking. All the channels with their mask bit set are masked whenever the CME signals indicates to use that masking, even if that bit position was needed to be masked on just one channel in just one satellite.

SUMMARY OF THE INVENTION

Principal aspects of the present invention are to provide a method and circuit for implementing enhanced scan data testing with minimization of over masking in an on product multiple input signature register (OPMISR) test due to Channel Mask Enable (CME) sharing, and a design structure on which the subject circuit resides. Other important aspects of the present invention are to provide such method and circuit substantially without negative effects and that overcome many of the disadvantages of prior art arrangements.

In brief, a method and circuit are provided for implementing enhanced scan data testing with minimization of over masking in an on product multiple input signature register (OPMISR) test due to Channel Mask Enable (CME) sharing, and a design structure on which the subject circuit resides. A common Channel Mask Scan Registers (CMSR) logic is used with a multiple input signature register (MISR). Individual local addressing is used for implementing enhanced scan data testing. An architecture and algorithm efficiently expand and target the use of the CME pins to minimize over-masking, to increase test pattern effectiveness with the use of individual local addressing.

In accordance with features of the invention, enhanced scan data testing is effectively and efficiently implemented, enabling data volume reduction and minimizing over masking.

In accordance with features of the invention, the Channel Mask Scan Registers (CMSRs) logic include two mask latches per MISR bit or Channel Mask Scan Bits and includes a local Mask Address Register (MAR) for each mask together with logic that allows more than two CME inputs.

In accordance with features of the invention, each satellite includes an AND forcing a zero into the tops of the channels during the data unload step of OPMISR. The AND function frees the 32 scan inputs (SIs) to now be used as Channel Mask Enable Addressed (CMEAs). A predefined number of bit, such as only the first 12 bits are designated as three 4-bit CMEAs though all could be used to support even more. These incoming CMEAs are compared with the local mask addresses to determine if a mask is applied in the current scan cycle.

In accordance with features of the invention, using individual local addressing allows for targeted masking as opposed to all CME=01 decode enabling all Mask1s or all CME=10 decode enabling all Mask2s, and also allows for triggering both Mask1s and Mask2s in the same or different satellites at the same time.

In accordance with features of the invention, the common Channel Mask Scan Registers (CMSR) logic includes one of a local Mask Address Register (MAR) for each mask and address hardcoding applied to each mask at the satellite.

In accordance with features of the invention, using gating to expand the number of Channel Mask Enable (CME) signal pairs. Any combination of the signal pairs can be triggered at once.

BRIEF DESCRIPTION OF THE DRAWINGS

The present invention together with the above and other objects and advantages may best be understood from the following detailed description of the preferred embodiments of the invention illustrated in the drawings, wherein:

FIGS. 2A and 2B respectively illustrate an example on product multiple input signature register (OPMISR) test circuit in accordance with preferred embodiments of the invention;

FIG. 5 illustrates first the best option which is to look for masks that are triggered together in this scan cycle and all other scan cycles where in this example F1 and G2 are always together so could be assigned the same address, freeing one for E2 in accordance with preferred embodiments of the invention;

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit are provided for implementing enhanced scan data testing with minimization of over masking in an on product multiple input signature register (OPMISR) test due to Channel Mask Enable (CME) sharing, and a design structure on which the subject circuit resides. A common Channel Mask Scan Registers (CMSR) logic is used with a multiple input signature register (MISR). Individual local addressing is used for implementing enhanced scan data testing. An architecture and algorithm efficiently expand and target the use of the CME pins while not increasing the test time to minimize over-masking, to increase test pattern effectiveness with the use of individual local addressing.

Figure 1:
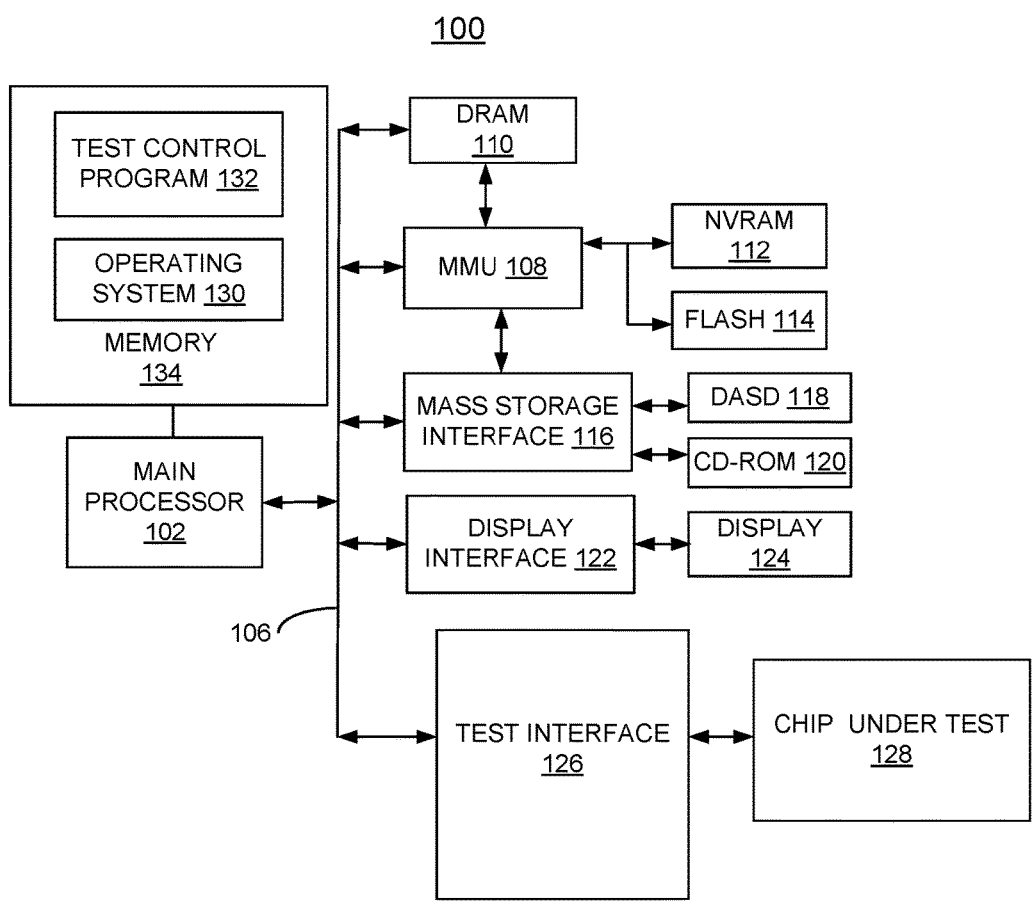
FIG. 1 is a block diagram representation illustrating an example computer test system for implementing enhanced scan data testing with over masking minimization in an on product multiple input signature register (OPMISR) test due to Channel Mask Enable (CME) sharing, and a design structure on which the subject circuit resides in accordance with the preferred embodiment.

With reference now to the drawings, in FIG. 1, there is shown an exemplary computer test system for implementing enhanced scan data testing with minimization of over masking in an on product multiple input signature register (OPMISR) test due to Channel Mask Enable (CME) sharing generally designated by the reference character 100 in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 connected to a display 124, and a test interface 126 coupled to the system bus 106. An integrated circuit device or chip under test 128 is coupled to the test interface 126. Computer system 100 includes an operating system 130, and a test control program 132 of the preferred embodiment resident in a memory 134.

Computer test system 100 is shown in simplified form sufficient for understanding the present invention. The illustrated computer test system 100 is not intended to imply architectural or functional limitations. The present invention can be used with various hardware implementations and systems and various other internal hardware devices, for example, multiple main processors.

Figure 2A:
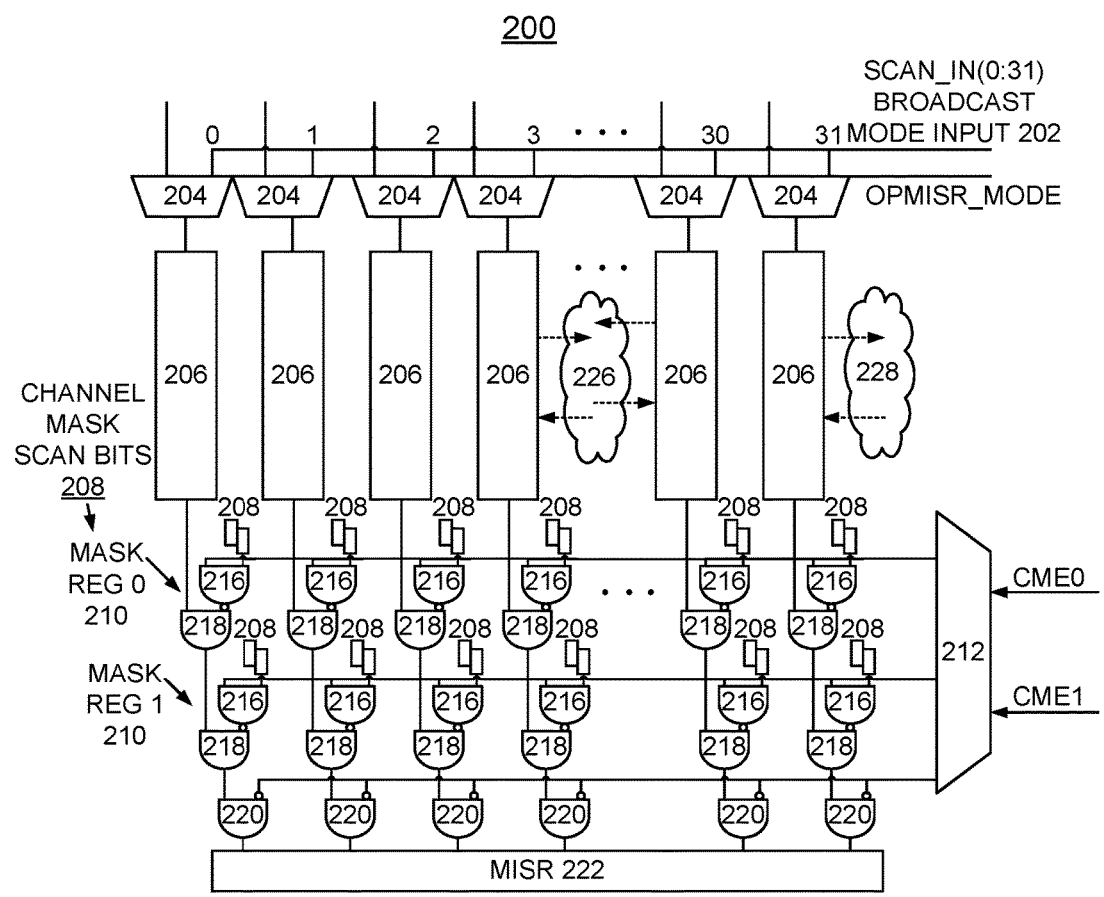

Referring now to FIGS. 2A and 2B, there is shown an example on product multiple input signature register (OPMISR) test circuit generally designated by the reference character 200 in accordance with preferred embodiments of the invention. The OPMISR test circuit 200 provides channel input patterns via a respective multiplexer 204 to a respective associated scan channel 206 used for the OPMISR scan data testing. A scan-in (0:31) broadcast mode input 202 is selectively coupled by the respective multiplexer 204 responsive to an OPMISR_MODE control input applied to the multiplexers 204. The OPMISR test circuit 200 includes OPMISR masking including two mask latches per MISR bit (referred to as Channel Mask Scan Bits 208 in Channel Mask Scan Registers (CMSRs) 0, 1, 210 and two Channel Mask Enable (CME) signals CME0, CME1 applied to CME logic 212. Each of the channel Mask Scan Registers (CMSRs) 0, 1, 210 include a respective pair of AND gates 216, 218 with an inverted output of AND gate 216 applied to AND gate 218. A respective AND gate 220 coupled to an output of AND gate 218 of mask register 1, 210 and an inverted logic output of CME logic 212 couples a respective channel bit position (0:31) to a Multiple Input Signature Register (MISR) 222 for on-chip data compression. Clouds 226, 228 represent the logic under test that while usually produce predictable data, they may also produce unpredictable values in the channels that require masking.

Referring to FIG. 2B, an example CME function table 230 is shown. For example, the CME signals decode to four states of: no masking (B0, B1: 0 0), use mask register 0 (B0, B1: 0 1), use mask register 1 (B0, B1: 1 0), or global MISR mask all channels (B0, B1: 1 1). The masking is applied as the data is unloaded from the respective channels 206 into the MISR 222. When a bit position in a channel is going to shift into the MISR, the global CME signal is set to the desired mask state. For example, if channel 3 needs scan position 28 to be ignored, when bit 28 of the channel is about to be shifted into the MISR during the unload, the CME signals could be set to use mask register 1. The channel 3 mask scan bit in mask register 1 would have previously been set to mask. Other mask bits for other channels may or may not have been set to mask based on needs for the rest of the scan data unload.

There advantageously can be multiple OPMISR satellites or OPMISR test circuits 200 spread throughout the chip under test. For most efficient scanning and less scan data, the Channel Mask Scan Bits 208 for register 0, 210 and register 1, 210 are scan initialized in parallel and shared across satellites. However this means all satellites have the same mask bits. Additionally, all satellites usually get the same CME information during unload. For the example above, if the first satellite needed bit 4 of the channel mask scan register set and used at the scan position 28 but the second satellite did not, the second satellite would unnecessarily be masked at the same time as the bit in the first register, since both satellites receive the same data for the channel mask scan register. Thus, while it is efficient to share channel mask scan register data, one is left with the problem of over masking. All the channels with their mask bit set will be masked whenever the CME signals say to use that masking, even if only one channel in one satellite needed that bit position masked.

Figure 3:
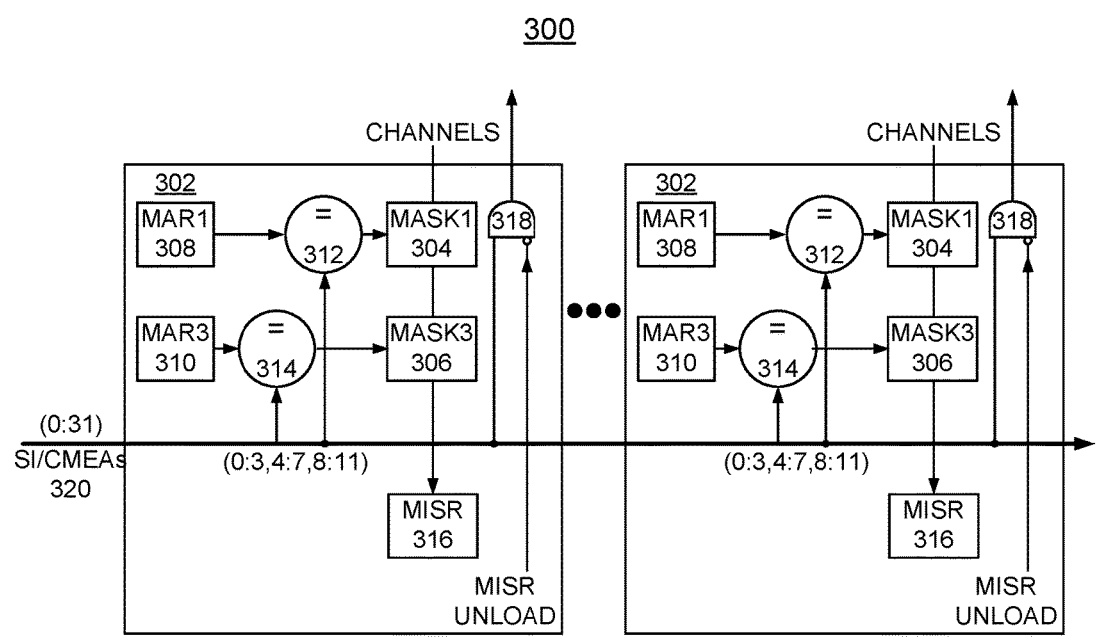
FIG. 3 illustrates an example on product multiple input signature register (OPMISR) test circuit in accordance with preferred embodiments of the invention.

Referring now to FIG. 3, there is shown an example on product multiple input signature register (OPMISR) test circuit generally designated by the reference character 300 in accordance with the preferred embodiment. On product multiple input signature register (OPMISR) test circuit 300 includes a plurality of satellites 302. Each satellite 302 in addition to a current pair of masks 304, 306 also includes a local Mask Address Register (MAR) 308, 310 for each respective mask 304, 306 as well as compare logic 312, 314 that allows more than the current 2 CME inputs. FIG. 3 shows at the right in each satellite 302 an AND gate 318 that forces a zero into the tops of the channels during the data unload step of OPMISR. This frees the 32 scan inputs (SIs) shown to now be used as Channel Mask Enable Addressed (CMEAs) SI/CMEAs 320. For example, in this example test circuit 300 only the first 12 bits are designated as three 4-bit CMEAs (0:3, 4:7, 8:11) though all could be used. These incoming CMEAs 320 are compared with the local mask addresses via compare logic 312, 314 to determine if a mask is applied in respective current scan cycle.

Circuit 300 not only allows for targeted masking as opposed to all CME=01 decode enabling all Mask1s, 304 or all Mask2s 306, but also allows for triggering both Mask1s, 304 and Mask2s, 306 in the same or different satellites 302 at the same time.

Figure 4:
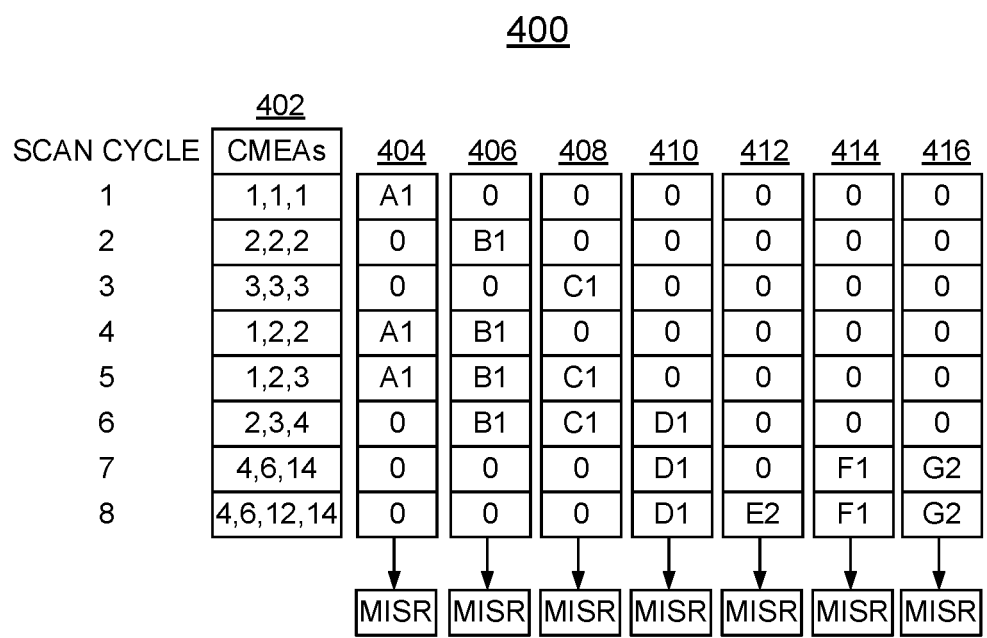
FIG. 4 illustrates example mask variations for an 8 scan cycle on seven satellites where in this example three 4-bit CMEAs triggering is limited to three satellites at once with different addresses, or any number more if the local addresses are set to the same value in accordance with preferred embodiments of the invention.

Referring now to FIG. 4, there are shown example mask variations generally designated by the reference character 400 in accordance with the preferred embodiment. Example mask variations 400 include CMEAs 402 with an 8 scan cycle on seven satellites 404, 406, 408, 410, 412, 414, 416. In example 400, three 4-bit CMEAs triggering is limited to three satellites at once with different addresses, or any number more if the local addresses are set to the same value in accordance with preferred embodiments of the invention. And the whole test is limited to 16 unique mask triggers, assuming the original CME pairs are still used for the no masking and mask-all options. Though removing that pair of input pins and associated wiring at the cost of two addresses is likely a good option.

Notice that in cycle 8 there is a need to apply 4 masks, while the example architecture supports only three CMEAs 402. Within this architecture a couple of options exist.

FIG. 5 illustrates example options generally designated by the reference character 500 in accordance with the preferred embodiment. A first option which is to look for masks that are triggered together in this scan cycle and all other scan cycles of this test. In this FIG. 5, F1 and G2 are only used in scan cycles 7 and 8 and are always together so F1 and G2 can be assigned the same address, freeing one for E2 in accordance with preferred embodiments of the invention A second option for scan cycle 8, as shown, includes adding another 4-bit address 4, 6, 12, 14 to the CMEA, which then sets the new limit to five at a time, and adds the new four wires and network out to all satellites 404, 406, 408, 410, 412, 414, 416.

A third option for scan cycles 7, 8, as shown, includes adding 3-bit address 4, 6, 14 and 4, 6, 12 to the CMEA 502 by adding another MAR to one or both addresses at each satellite. In this example G2 could be given both local addresses 12 and 14 so it can be triggered two different ways.

Figure 6:
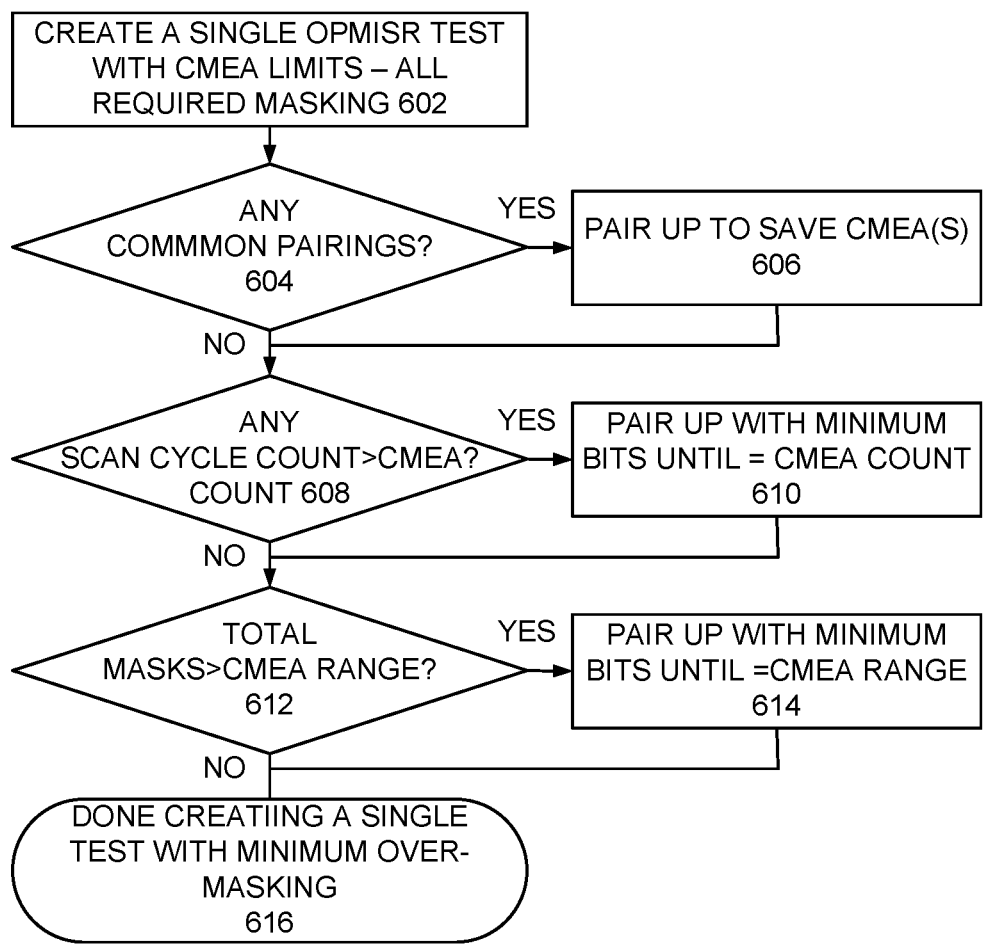
FIG. 6 is a flow chart illustrating example algorithm test operations in accordance with the preferred embodiments.

Referring now to FIG. 6, there is shown a flow chart illustrating example algorithm test operations generally designated by the reference character 600, in accordance with the preferred embodiment. In the illustrated algorithm 600 of FIG. 6, best pairs masking is used to again minimize over-masking impacts.

As indicated at a block 602, each OPMISR test is created assuming no limits to masking. This result would fit fine within the current two CME, two mask architecture only if only two unique mask scan cycles are needed. The example with the new three 4-bit CMEAs can handle up to 48 unique mask scan cycles, with any one cycle triggering up to 3 masks with no over-masking. Those will flow quickly through this algorithm, while some others can be tuned for no or minimal masking.

As indicated at a decision block 604, querying the masking across the test is performed to identify common pairings, any masks on different satellites that are always triggered together. As indicated at a block 606, these are paired (always given the same address), freeing addresses for others that are unique. As indicated at a decision block 608, then looking is performed to see if in any one scan cycle more masking is needed than can fit within the CME count. Our example can handle three, but not four. If four or more exist, then as indicated at a block 610 pairing is used to pair up masks with the minimum bits. While this will result in over-masking when both are called and only one needed, at least the extra call will mask the smallest number of bits.

As indicated at a decision block 612, looking is performed to see if there are more unique mask calls than the addressing scheme permits. In our example, the 4-bit address allows sixteen different masks across the entire satellite to be used in any one complete test. As indicated at a block 614, should more than that be required, pairing address assignments between masks with minimal bits is performed to again afford the least over-masking penalty. Finally, as indicated at a block 616 the process ends with the final test data created with minimal masking.

Figure 7:
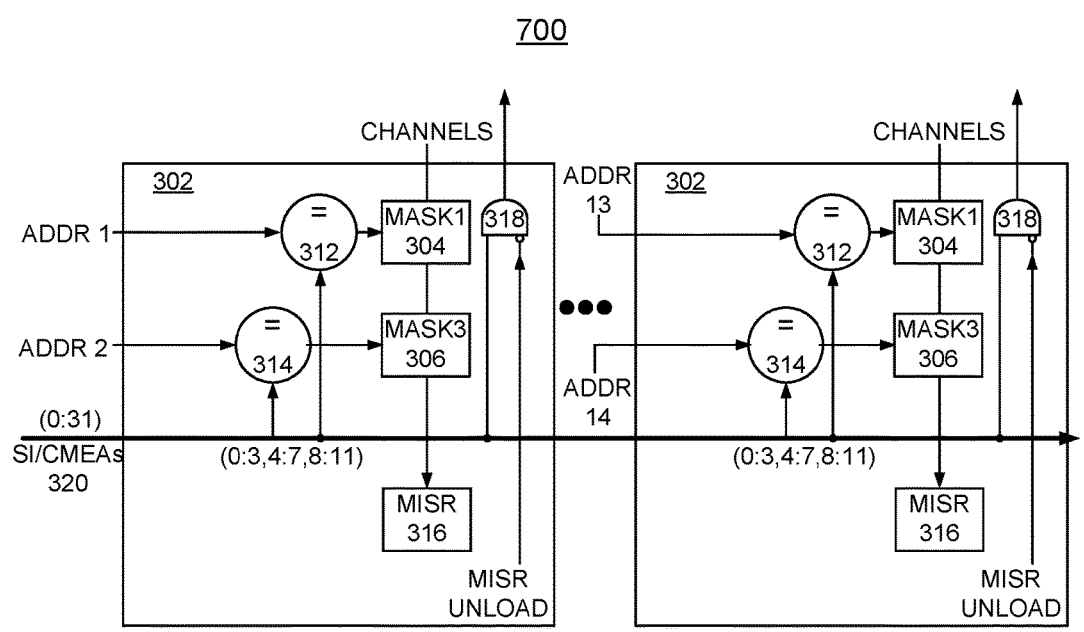
FIG. 7 illustrates an architecture that saves the real estate and programming time of having local MARs including hardcodes the addresses for each mask at the satellite in accordance with the preferred embodiments.

Referring now to FIG. 7, there is shown an example on product multiple input signature register (OPMISR) test circuit generally designated by the reference character 700, in accordance with the preferred embodiments. Test circuit 700 illustrates an architecture that saves the real estate and programming time required by local MARs 308, 310 of test circuit, by including hardcode addressing indicated by lines labeled ADDR 1, ADDR 2 to apply the addresses for each mask 304, 306 at each respective satellite 302 in accordance with the preferred embodiments. For example, in this example test circuit 700 optionally only the first 12 bits are designated as three 4-bit CMEAs (0:3, 4:7, 8:11) though all could be used. These incoming CMEAs 320 are compared with the hardcoded local mask addresses ADDR 1, ADDR 2 via compare logic 312, 314 to determine if a mask is applied in respective current scan cycle. For example, using this example only 16 unique addresses are available, so the ties will be repeated after only 8 satellites. Simply bumping the address size to 5 bits increases the repeats to after 16 satellites, which in many cases is enough. Additionally, the flexibility of being able to pair MARs to basically extend the address range and avoid over-masking in some cases is lost.

Figure 8:
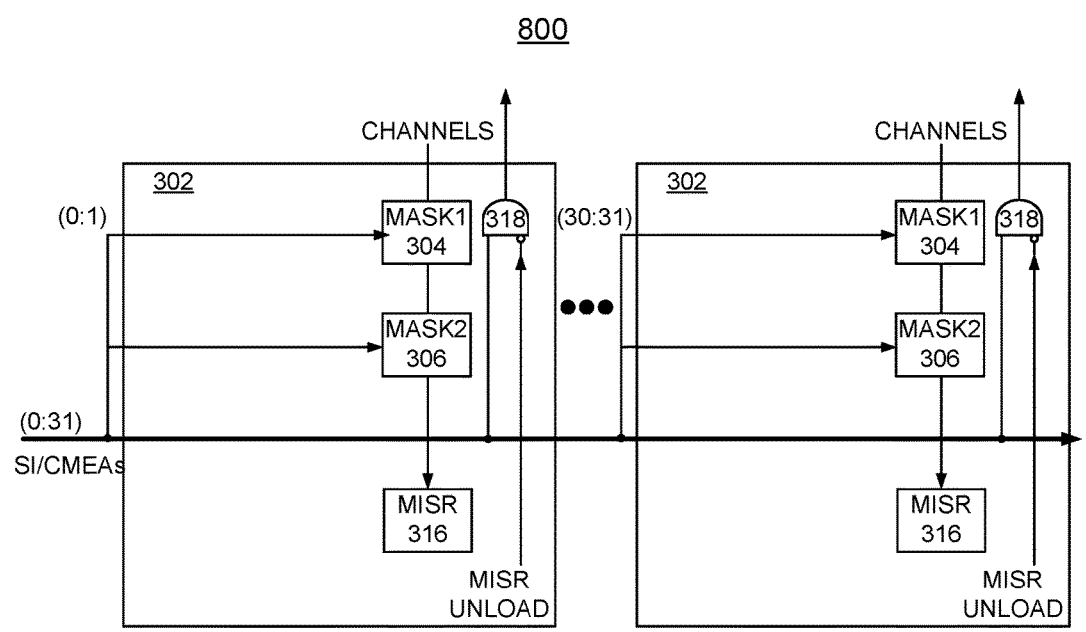
FIG. 8 illustrates another architecture with gating freeing additional chip pins, used to expand the number of CMEs at the satellite in accordance with the preferred embodiments.

Referring now to FIG. 8, there is shown an example on product multiple input signature register (OPMISR) test circuit generally designated by the reference character 800, in accordance with the preferred embodiments. Test circuit 800 in FIG. 8 illustrates another architecture with gating freeing additional chip pins, used to expand the number of CMEs at the satellite in accordance with the preferred embodiments. Using the entire 32 bit range in the example, circuit 800 plus the existing 2 bits of CME allows the example design to have 17 CME pairs. Satellites 302 will not repeat CME use until after 17, and any combination of the 17 pairs can be triggered at once. If there is a lot of masking then this could be an advantage over the previous architectures shown in FIGS. 3 and 7. However, it does require many fully timed CME paths. Comparing more fairly with the example circuits 300, 700, test circuit 800 has for example 12 signals used for 6 CME pairs that repeat after only 6 satellites 302. However, each of these 6 CME pairs need only feed the satellites 302 that use it, rather than all satellites 302 getting all 12 signals in the example circuits 300, 700.

Figure 9:
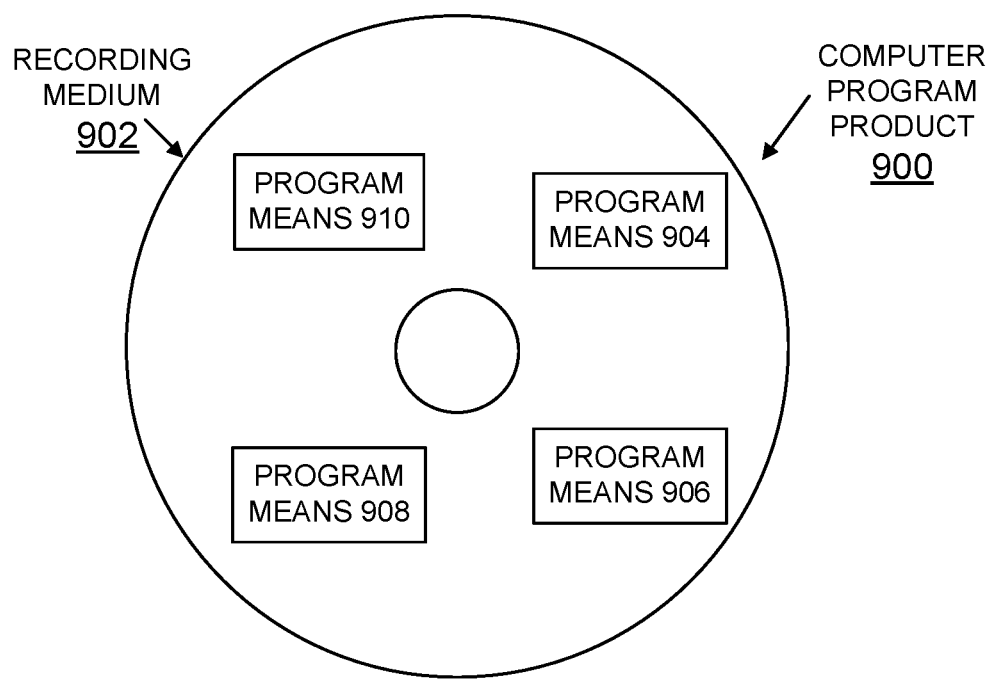
FIG. 9 is a block diagram illustrating a computer program product in accordance with the preferred embodiments.

Referring now to FIG. 9, an article of manufacture or a computer program product 900 of the invention is illustrated. The computer program product 900 includes a recording medium 902, such as, a floppy disk, a high capacity read only memory in the form of an optically read compact disk or CD-ROM, a tape, or another similar computer program product. Recording medium 902 stores program means 904, 906, 908, and 910 on the medium 902 for carrying out the methods for implementing enhanced scan data testing of the preferred embodiment in the system 100 of FIG. 1.

A sequence of program instructions or a logical assembly of one or more interrelated modules defined by the recorded program means 904, 906, 908, and 910, direct the computer system 100 for implementing enhanced scan data testing of the preferred embodiment.

Figure 10:
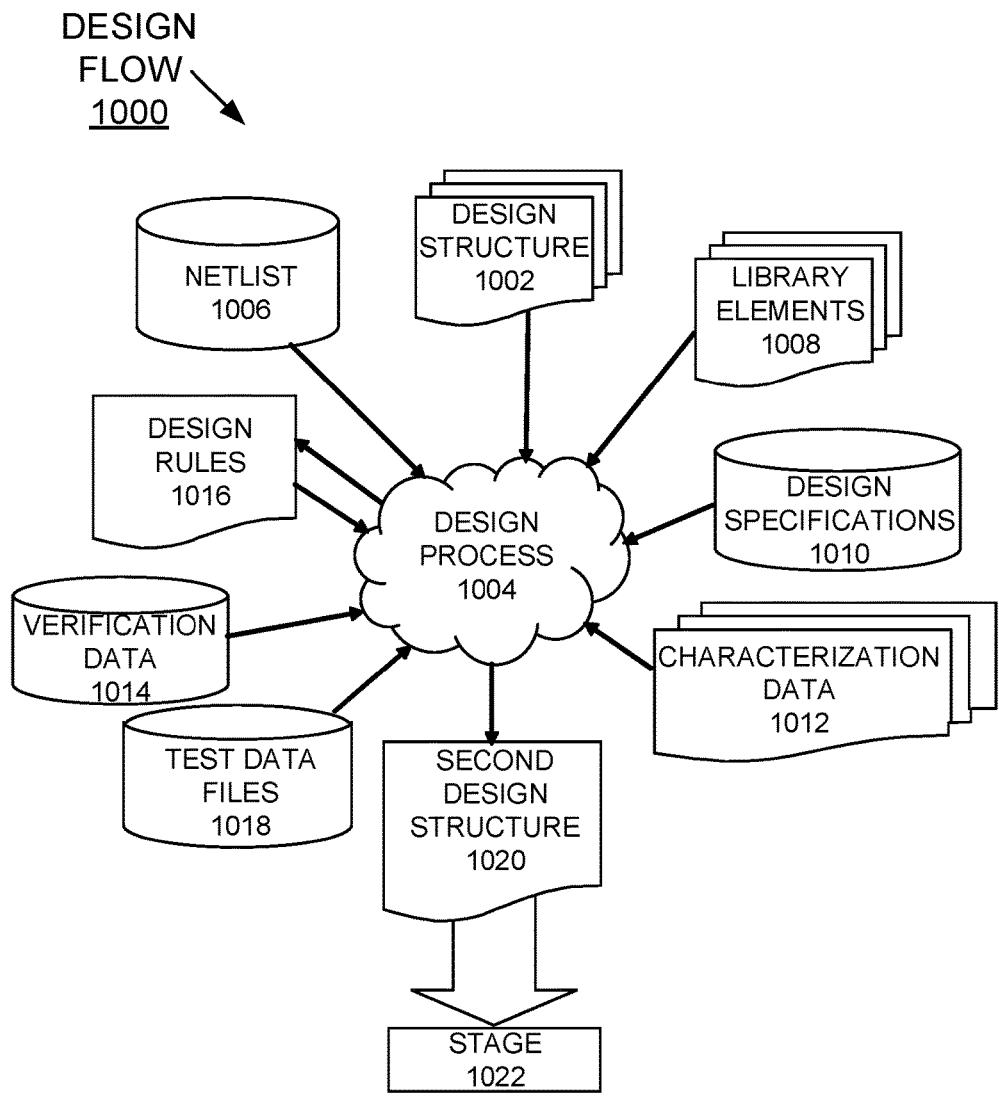
FIG. 10 is a flow diagram of a design process used in semiconductor design, manufacturing, and/or test.

FIG. 10 shows a block diagram of an example design flow 1000. Design flow 1000 may vary depending on the type of IC being designed. For example, a design flow 1000 for building an application specific IC (ASIC) may differ from a design flow 1000 for designing a standard component. Design structure 1002 is preferably an input to a design process 1004 and may come from an IP provider, a core developer, or other design company or may be generated by the operator of the design flow, or from other sources. Design structure 1002 comprises circuits 100, 200, 300, 700, 800 in the form of schematics or HDL, a hardware-description language, for example, Verilog, VHDL, C, and the like. Design structure 1002 may be contained on one or more machine readable medium. For example, design structure 1002 may be a text file or a graphical representation of circuit 300. Design process 1004 preferably synthesizes, or translates, circuits 100, 200, 300, 700, 800 into a netlist 1006, where netlist 1006 is, for example, a list of wires, transistors, logic gates, control circuits, I/O, models, etc. that describes the connections to other elements and circuits in an integrated circuit design and recorded on at least one of machine readable medium. This may be an iterative process in which netlist 1006 is resynthesized one or more times depending on design specifications and parameters for the circuits.

Design process 1004 may include using a variety of inputs; for example, inputs from library elements 1008 which may house a set of commonly used elements, circuits, and devices, including models, layouts, and symbolic representations, for a given manufacturing technology, such as different technology nodes, design specifications 1010, characterization data 1012, verification data 1014, design rules 1016, and test data files 1018, which may include test patterns and other testing information. Design process 1004 may further include, for example, standard circuit design processes such as timing analysis, verification, design rule checking, place and route operations, and the like. One of ordinary skill in the art of integrated circuit design can appreciate the extent of possible electronic design automation tools and applications used in design process 1004 without deviating from the scope and spirit of the invention. The design structure of the invention is not limited to any specific design flow.

Design process 1004 preferably translates an embodiment of the invention as shown in FIGS. 1, 2A, 3, 7 and 8 along with any additional integrated circuit design or data (if applicable), into a second design structure 1020. Design structure 1020 resides on a storage medium in a data format used for the exchange of layout data of integrated circuits, for example, information stored in a GDSII (GDS2), GL1, OASIS, or any other suitable format for storing such design structures. Design structure 1020 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2A, 3, 7 and 8. Design structure 1020 may then proceed to a stage 1022 where, for example, design structure 1020 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing enhanced scan data testing with over masking minimization in an on product multiple input signature register (OPMISR) comprising:
providing one or more OPMISR satellites, each of the one or more OPMISR satellites including a multiple input signature register (MISR) for data collection and a plurality of associated scan channels;
providing common Channel Mask Scan Registers (CMSR) logic with the multiple input signature register (MISR);
using individual local addressing for implementing enhanced scan data testing; and
expanding and targeting use of Channel Mask Enable (CME) pins to minimize over-masking, to increase test pattern effectiveness with the use of individual local addressing.

2. The method as recited in claim 1, wherein using individual local addressing for implementing enhanced scan data testing enables data volume reduction and minimizing over masking.

3. The method as recited in claim 1, wherein using individual local addressing for implementing enhanced scan data testing comprises providing two mask latches per Channel Mask Scan bit and a local Mask Address Register (MAR) for each mask for implementing common Channel Mask Scan Registers (CMSR) logic.

4. The method as recited in claim 3, further comprising providing logic enabling more than two Channel Mask Enable (CME) inputs.

5. The method as recited in claim 1, wherein using individual local addressing for implementing enhanced scan data testing comprises providing two mask latches per Channel Mask Scan bit and address hardcoding applied to each mask for implementing common Channel Mask Scan Registers (CMSR) logic.

6. The method as recited in claim 1, wherein using individual local addressing for implementing enhanced scan data testing enables targeted masking.

7. The method as recited in claim 6, wherein using individual local addressing for implementing enhanced scan data testing enables triggering both a first mask and a second mask in a same satellite and different satellites at the same time.

8. The method as recited in claim 1, further comprising forcing a zero into tops of scan channels during a data unload step of OPMISR testing.

9. The method as recited in claim 1, further comprising providing an AND function for freeing the 32 scan inputs (SIs) for use as Channel Mask Enable Addressed (CMEAs).

10. The method as recited in claim 9, further comprising designating a predefined number of incoming CMEAs bits and comparing the incoming CMEAs bits with the local mask addresses to determine if a mask is applied in the current scan cycle.

11. A circuit for implementing enhanced scan data testing with over masking minimization in an on product multiple input signature register (OPMISR) comprising:
at least one OPMISR satellite, the at least one OPMISR satellite including a multiple input signature register (MISR) for data collection and a plurality of associated scan channels;
common Channel Mask Scan Registers (CMSR) logic provided with the multiple input signature register (MISR) for using individual local addressing for implementing enhanced scan data testing, and expanding and targeting use of Channel Mask Enable (CME) pins to minimize over-masking, to increase test pattern effectiveness with the use of individual local addressing.

12. The circuit as recited in claim 11, wherein said common Channel Mask Scan Registers (CMSR) logic comprises two mask latches per MISR bit or Channel Mask Scan bits.

13. The circuit as recited in claim 12 further comprising Channel Mask Enable (CME) signals coupled to said common Channel Mask Scan Registers (CMSR) logic.

14. The circuit as recited in claim 12 further comprising a local Mask Address Register (MAR) for each mask together with logic that allows more than two Channel Mask Enable (CME) inputs.

15. The circuit as recited in claim 12 further comprising hardwired addressing applied to each mask together with logic that allows more than two Channel Mask Enable (CME) inputs.

16. The circuit as recited in claim 11, wherein said common Channel Mask Scan Registers (CMSR) logic comprises gating logic to expand the number of Channel Mask Enable (CME) signal pairs.

17. The circuit as recited in claim 16, wherein said gating logic enables any combination of the signal pairs to be triggered at once.

18. The circuit as recited in claim 11, wherein said common Channel Mask Scan Registers (CMSR) logic comprises an AND gate provided with each satellite for forcing a zero into tops of scan channels during the data unload step of OPMISR.

19. The circuit as recited in claim 11, wherein said common Channel Mask Scan Registers (CMSR) logic comprises said AND function freeing 32 scan inputs (SIs) for use as Channel Mask Enable Addressed (CMEAs).

20. The circuit as recited in claim 19, wherein said common Channel Mask Scan Registers (CMSR) logic comprises logic to compare incoming CMEAs with local mask addresses to determine if a mask is applied in the current scan cycle.

* * * * *